United States Patent [19]

Silberberg

[11] 4,006,413
[45] Feb. 1, 1977

[54] FIELD INSTRUMENT FOR MEASUREMENT OF AC VOLTAGE FLUCTUATIONS

[75] Inventor: Jeffrey L. Silberberg, Baltimore, Md.

[73] Assignee: The United States of America as represented by the Department of Health, Education and Welfare, Washington, D.C.

[22] Filed: Dec. 19, 1974

[21] Appl. No.: 534,237

[52] U.S. Cl. .............................. 324/103 P; 324/102
[51] Int. Cl.² ................. G01R 19/16; G01R 19/00
[58] Field of Search ........ 324/103 P, 103 R, 99 D, 324/102; 328/151; 307/235 A

[56] References Cited

UNITED STATES PATENTS

| | | | |
|---|---|---|---|
| 2,591,738 | 4/1952 | Spencer | 324/102 |
| 3,225,213 | 12/1965 | Hinrichs et al. | 328/151 |
| 3,502,980 | 3/1970 | Baggott | 324/103 R |
| 3,593,133 | 7/1971 | Wisner | 324/103 R |
| 3,600,565 | 8/1971 | Forbes, Sr. | 324/103 P |
| 3,733,601 | 5/1973 | Oliver | 324/103 R |

Primary Examiner—R. V. Rolinck
Assistant Examiner—Ernest F. Karlsen
Attorney, Agent, or Firm—Browdy and Neimark

[57] ABSTRACT

An apparatus for measuring and displaying the sag and surge voltage values of an AC power supply. Two inputs are attenuated, filtered and the peak difference is converted to a binary number by an analog-to-digital (A/D) converter. A digital comparator compares these conversions with the values stored in a maximum and minimum register. If the output of the A/D is larger than the contents of the maximum register, the previous maximum register's contents are replaced by the A/D output. If the output of the A/D is smaller than the contents of the minimum register, the previous minimum register's contents are replaced by the A/D output. Dual light emitting diode displays provide a numerical readout of the contents of the maximum and minimum registers.

9 Claims, 6 Drawing Figures

FIELD INSTRUMENT FOR MEASUREMENT OF AC VOLTAGE FLUCTUATIONS

FIELD OF THE INVENTION

This invention relates to a device for measuring the AC voltage fluctuation and, more particularly, to a high accuracy, high resolution, fast response field device which stores and displays the sag and surge voltage values of an AC source for X-ray machines under worst case conditions.

BACKGROUND OF THE INVENTION

Under P.L. 90–602, "The Radiation Control For Health and Safety Act of 1968", manufacture and accountability for X-ray system performance is deemed to be contingent upon the ability of the AC power supply to meet the equipment's minimum requirements as specified by the manufacturer. The greatest demand on the AC supply occurs during a radiographic exposure, usually at the highest current setting, and the highest kilovolt peak (kVp) setting permitted at that current by X-ray tube cooling characteristics. To prevent overheating of the tube at this setting, exposure time must be short. Thus, in evaluating the adequacy of the AC source under worst case conditions, the test instrumentation used must have a fast response.

Previously, peak voltmeters have been used to measure the surge voltage. However, these instruments have proved to be unsatisfactory because they do not measure the minimum voltage. Oscilloscopes and special preamplifier-strip chart recorder combinations may have storage facilities, high accuracy, and fast response, but their resolution is low and their bulkiness usually precludes portability. Digital voltmeters have high resolution and accuracy but show a very slow response.

SUMMARY OF THE INVENTION

This invention incorporates all of the above features. It measures AC voltage to a high degree of accuracy (plus or minus 0.1% of full scale at 25° C for pure sine wave), settles to 99.9% of the final reading in less than 25 milliseconds, stores and displays both the maximum and minimum AC voltage over the period of interest, and can be used to determine line voltage regulation to plus or minus 0.1% over a wide range of temperature and harmonic distortion. In addition, the line voltage monitor was designed to be lightweight and portable for field use. This line voltage monitor has been described in *A Line Voltage Monitor for Determining AC Supply Regulation to a Diagnostic X-Ray Source*, DHEW Publication (FDA) 74-8025 (June, 1974) and is hereby incorporated by reference.

The line voltage monitor, as described in more detail below, has two inputs isolated from ground which feed a differential amplifier. This circuit attenuates the input signals while subtracting one from the other, thereby generating a difference signal. A signal conditioning section filters the difference signal and stores the peak value of the voltage waveform for conversion to a binary number by the analog-to-digital (A/D) converter.

A digital comparator examines the resultant of each A/D conversion, comparing the converter's output with the contents of the maximum register and the contents of the minimum register. If the output of the A/D is larger than the contents of the maximum register, the previous maximum register's contents are replaced by the A/D output. If the output of the A/D is smaller than the contents of the minimum register, the previous minimum register's contents are replaced by the A/D output. Dual light-emitting diode (LED) displays provide a numerical readout of the contents of the maximum and minimum registers.

The Line Voltage Monitor (LVM) was designed for use in determining line voltage regulation to a diagnostic X-ray source, and not for use as a general-purpose root-square-mean (RMS) voltmeter. Accuracy in measurement of true RMS voltage was sacrificed for savings in cost and required component space, while high accuracy in determination of line voltage regulation was maintained.

The RMS voltage of a pure 60.0 Hz sine wave input is determined by the LVM to an accuracy of ±0.1% of full scale (at 25° C). The circuit, under the direction of a crystal controlled timer, stores the value of the filtered input signal that occurs 4.167 milliseconds after the signal passes through zero in the sample-and-hold. For a 60.0 Hz sine wave, this corresponds to the voltage peak, which is then encoded into a binary number. The voltage measured is divided by $V_2^-$ to obtain a value representative of RMS voltage. This peak-sampling technique has distinct advantages over conventional analog peak detectors in that there are no nonlinearities introduced by diodes, and no capacitor discharging is required to follow a drop in peak voltage.

The two factors that preclude the use of the LVM as a true RMS voltmeter while having no effect on the determination of line voltage regulation to a diagnostic X-ray source (defined $[(V_N - V_L)/V_L](100\%)$, where $V_N$ is the RMS voltage under noload conditions and $V_L$ is the RMS voltage with the load applied) are the exclusion of high frequency transients from consideration in the RMS voltage and the absence of compensation for errors due to harmonic distortion and frequency deviation from 60.0 Hz. High frequency transients in the AC supply to a diagnostic X-ray source have no effect on the radiation output, due to filtering within the system; therefore, the high frequency components ignored by the lVM are also ignored by the X-ray source. Errors due to harmonic distortion and frequency deviation from 60.0 Hz appear as a constant factor multiplying the LVM reading, as long as the waveshape (percent distortion) and frequency remain constant; thus, the errors cancel when line voltage regulation is computed.

In areas where the line frequency is 50 Hz, the only modification necessary is replacement of the 983 kHz oscillator with an 819.2 kHz oscillator.

It is accordingly an object of the present invention to overcome the defects of the prior art such as indicated above.

Another object of the present invention is to improve the safety of radiographic equipment.

A further object is to improve the measurement of AC voltage values.

Another object of the invention is to provide an AC line voltage monitor which stores both the surge and sag voltage values.

A further object is to provide a line voltage monitor which is highly accurate, exhibits high resolution, and has a fast response time.

Yet another object is to provide a line voltage monitor which is lightweight and portable.

Still another object is to provide a line voltage monitor which may be used in evaluating the adequacy of an AC source under worst case conditions.

Yet another object is to provide a line voltage monitor for determining AC supply regulation for a diagnostic X-ray source.

The above and other objects and advantages of this invention will be apparent from the following description of an embodiment of this invention, reference being made to the accompanying diagram. The particular circuits shown in these drawings are not to be limitative since one possessing normal skill in the art may make changes in this circuitry without departing from the scope of the invention.

DETAILED DESCRIPTION OF A PREFERRED EMBODIMENT

Figure 1:
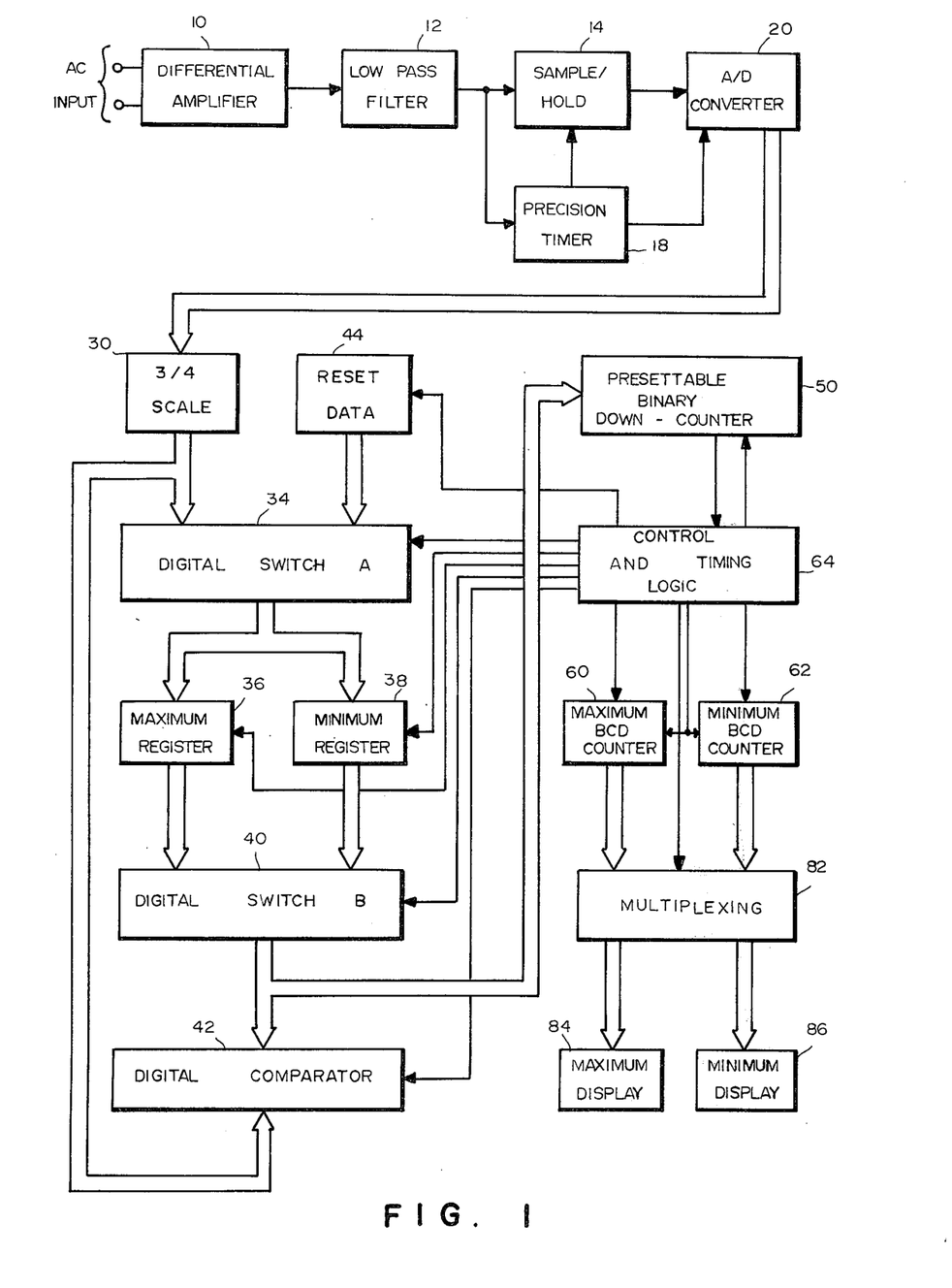
FIG. 1 is a detailed block diagram of the line voltage monitor.
Figure 2:
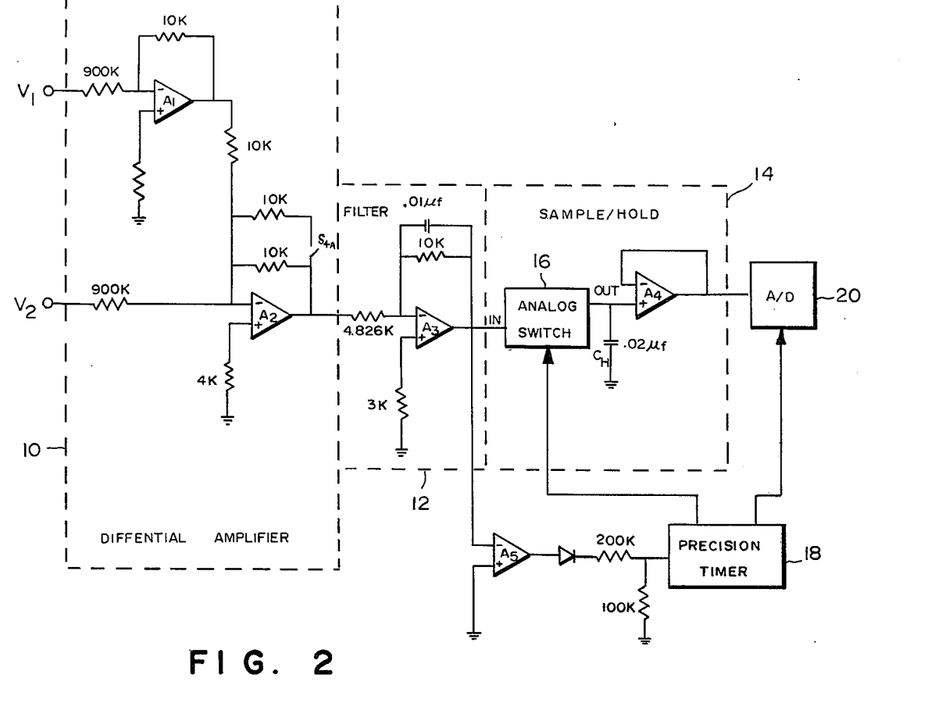
FIG. 2 is a circuit diagram of the analog section of the line voltage monitor.

As shown in FIGS. 1 and 2, the AC voltages to be measured are introduced to differential amplifier 10 consisting of two operational amplifiers $A_1$ and $A_2$. $A_1$ attenuates input $V_1(t)$ to $(-1/90)/V_1(t)$, and with $S_4$ open (300V scale), amplifier $A_2$ attenuates $V_2(t)$ to $(-1/90)V_2(t)$ and adds it to $-(-1/90)V_1(t)$, the result being $[V_1(t) - V_2(t)]/90$. With $S_4$ closed (600V scale), the output of $A_2$ is (½) $[V_1(t) - V_2(t)]/90$, or $[V_1(t) - V_2(t)]/180$. This difference signal is then amplified and filtered by a low pass filter 12 containing an operational amplifier $A_3$, which has a single pole at 1.57 kHz and a passband gain of 2.072. $S_4$ regulates the range of interest of the monitor and is activated from a switch on a control console (not shown).

The next analog stage is a sample-and-hold circuit 14 composed of an analog switch 16, capacitor $C_H$ and operational amplifier $A_4$. This circuit operates in a sample mode or a hold mode, the operation of which will be described in more detail below. Amplifier $A_5$ triggers a 4.167 millisecond precision timer 18 whenever the output of $A_3$ crosses zero in a negative-going direction, causing the sample-and-hold 14 to store the negative peak of each cycle of the 60.0 Hz input. The sample-and-hold has a gain of 1.0, droop rate of 1.25 mV/msec, and a slew rate of 2.5 V/μsec.

The sample-and-hold circuit 14 is connected to an analog-to-digital converter 20 (Datel ADC-CM12B) which uses low power state-of-the-art CMOS digital logic, and dissipates only 95 mW (at 60 conversions per second). A/D conversion is triggered by the trailing edge of an 18 microsecond (μsec) pulse, whose leading edge coincides with the initiation of the hold mode in the sample-and-hold and which lasts 300 μsec. In this time, the sample-and-hold voltage "droops" 375 μV, which is smaller than the resolution of the A/D. The A/D 20 has a magnitude "gain" of 409.5 since a −10 volt input results in an output of 4095 (binary).

Figure 3:
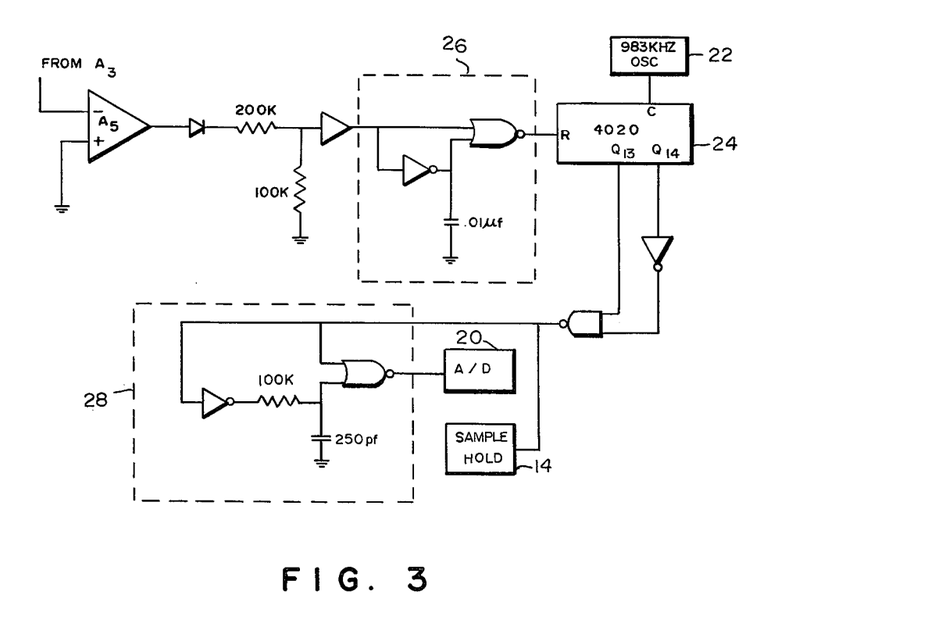
FIG. 3 is a circuit diagram of the precision timer of the line voltage monitor.

As depicted in FIG. 3, the precision timer 18 consists of a 983 kHz (± 0.005%) cyrstal oscillator 22, an RCA CD4020 14-bit binary counter (frequency divider) 24, and gating logic 26 and 28. The output of amplifier $A_5$ is clipped of negative voltages, attenuated to ⅓ of the output of $A_5$, and buffered to produce a timing signal whose level corresponds to a logical 1 when the filtered sine wave is positive and a logical 0 when the filtered sine wave is negative. A 1 to 0 transition of this signal (corresponding to a negative-going zero crossing of the filtered sine wave) triggers a one-shot 26 which resets the 14-bit counter 24 with a five microsecond pulse. The counter 24 is thus synchronized to the filtered sine wave, and the $Q_{14}$ output ($f_{in} \div 2^{14}$) will duplicate the buffered output of $A_5$. $Q_{13}$ has a frequency twice that of $Q_{14}$, and the signal resulting when the logical operation $\overline{Q_{14}} \cdot Q_{13}$ is performed is a logical 1 for 4.167 milliseconds after the counter is reset, a logical 0 for the next 4.167 milliseconds, and a logical 1 for the remaining 8.333 milliseconds of the cycle. Thus, the total cycle is 16.67 milliseconds. $\overline{Q_{14}} \cdot Q_{13}$ controls the analog switch 16 of the sample-and-hold 14, causing the circuit to switch to the hold mode at the peak of the filtered 60.0 Hz sine wave. The 1 to 0 transition of $\overline{Q_{14}} \cdot Q_{13}$ also triggers a one-shot 28, which outputs an 18 microsecond pulse. The leading edge of this pulse resets the A/D converter 20 and the trailing edge initiates conversion. Thus, the commencement of A/D conversion follows storage in the sample-and-hold 14 by 18 microseconds.

The encoding scheme of the 12-bit A/D converter 20 (12-bit binary) was selected in order to achieve four digit resolution with maximum accuracy over the ranges of interest (0–300 V, 0–600 V). The gain of the analog section was chosen so that a full scale analog input produced the maximum allowable input to the A/D. Also, in order to reduce measurement uncertainty over the ranges of interest and to provide full scale ranges of 307.1 and 614.2, the A/D output is multiplied by ¾ through binary arithmetic techniques.

Economy in both price and package count dictated the use of a 12-bit binary A/D converter, with conversion to BCD for display purposes only, rather than the use of a four-digit BCD A/D converter, with the required comparison and storage of four-digit BCD numbers.

Figure 4:
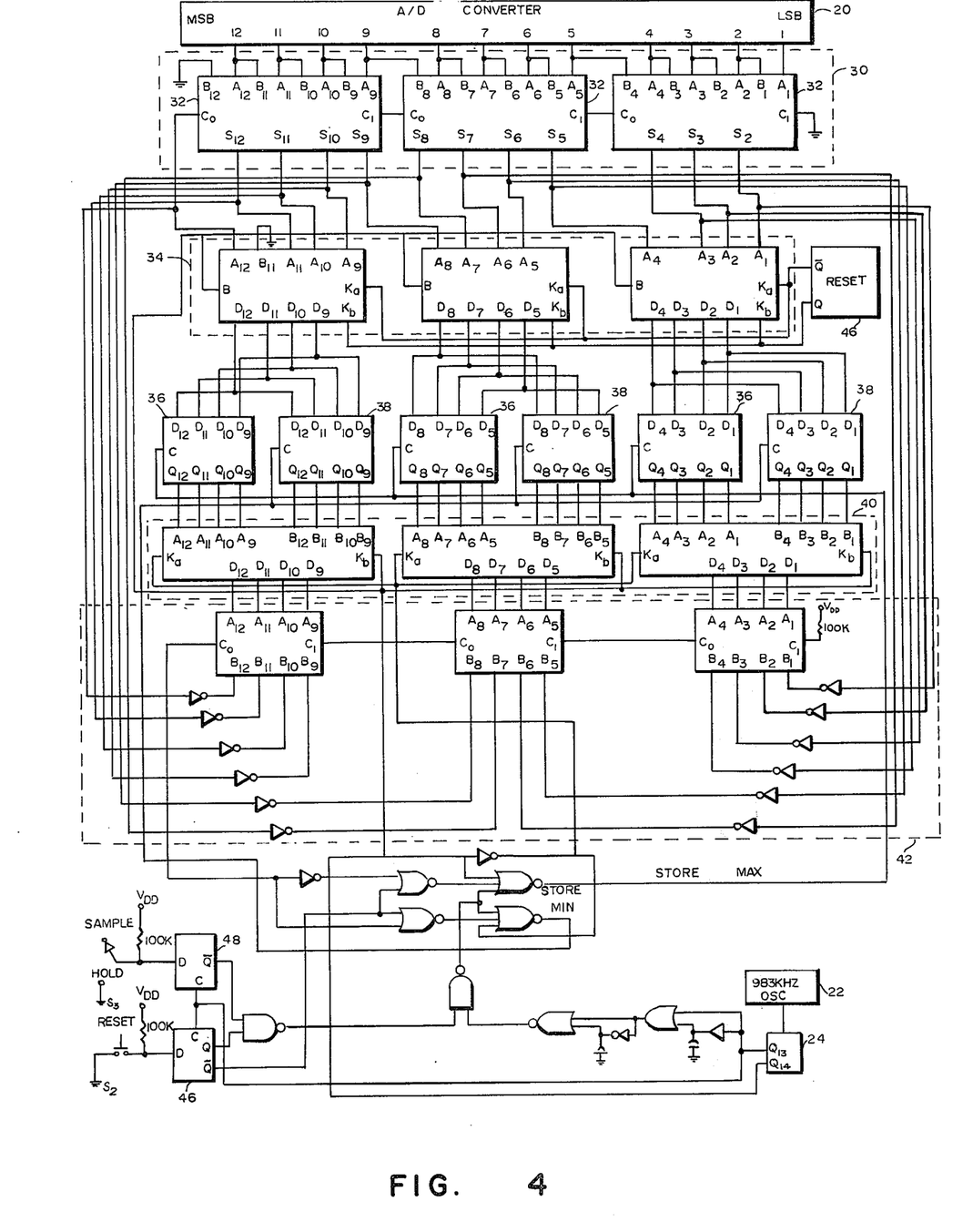
FIG. 4 is a circuit diagram of the storage and comparison section of the line voltage monitor.

The first stage of digital logic which operates on the output of the A/D converter 20 is a ¾ scaler 30 which acts as a multiplier (see Figure), multiplying the A/D output by ¾. This is accomplished, using a 12-bit binary adder 32 consisting of three RCA CD4008's by adding the A/D output to one-half itself, then dividing the sum by two. Binary division by $2^n$ is accomplished by shifting the binary number $n$ bits to the right. Similarly binary multiplication by $2^n$ is accomplished by shifting the binary number $n$ bits to the left. Three-halves the A/D output is obtained by connecting each $B_i$ adder input to the $A_{i+1}$ input ($B_{12} = 0$). By using lines $S_2$ through $S_{12}$ and the carry from the most-significant-bit (MSB) adder as the output, the binary number from the A/D in thus "amplified" by ¾.

The next stage in the data flow is a 12-bit digital switch 34 (denoted as digital switch A) which is used in the resetting of the maximum (Max) register 36 and the minimum (Min) register 38. Both the maximum register 36 and the minimum register 38 consist of three RCA CD4042's.

During normal operation, the output of the ¾ scaler 30 is gated to the register inputs. When the Line Voltage Monitor is reset, however, the 12-bit digital switch 34 gates a reset signal to both registers, such that the Max register 36 is set to 000.0 and the Min register 38 is set to 307.1. In this way, the first data sample after a reset will become simultaneously the new maximum and minimum, until further data is accumulated. This reset signal is activated by a switch $S_2$ and a D flipflop 46 (RCA CD4013).

The data which was converted to digital representation and then "amplified" by ¾ is gated to a digital comparator 42 for comparison with the contents of the maximum register 36 and the minimum register 38. A digital switch B 40 between the comparator 42 and the storage registers 36 and 38 consists of three RCA CD4019's and allows the comparator 42 to compare each data sample with the contents of either the maximum register 36 or the minimum register 38, but not both at the same instant. This switch is commutated by frequency divider 24.

Each data sample is presented to the inputs of both registers 36 and 38, but is stored only under proper conditions. If the new data sample is larger than the contents of the Max register 36, a pulse is gated to the maximum register clock input $C_1$ and the new data sample is stored in the Max register 36. If the new data sample is smaller than the contents of the Min register 38, a pulse is gated to the Min register clock input $C_2$ and the new data sample is stored in the Min register 38.

The digital comparator 42 consists of a 12-bit binary adder and twelve inverters. The comparison operation is accomplished by subtracting the new data sample (NDS) from the register contents (RCS) using two's complement arithmetic. The two's complement of the new data sample is produced by the complementation of each data bit, and the presence of a hard-wired logical 1 on the adder carry input. If RCS-NDS $\geq$ 0 (RCS $\geq$ NDS), the carry output of the adder will be a logical 1. If RCS-NDS<0 (RCS<NDS), the carry output of the adder will be a logical 0. The adder carry output is applied directly to the gating of the Min register 38 and is complemented prior to being used in gating for the Max register 36. In this manner, a logical 1 to either register gating network causes the new data sample to be stored.

The RESET Switch $S_2$ and the SAMPLE/HOLD Switch $S_3$ control D flipflops (RCA CS4013) 46 and 48, respectively, so that the RESET and SAMPLE/HOLD signals cannot change during register storage. If $S_3$ is in the HOLD position, STORE commands are prevented from reaching the registers unless $S_2$ is depressed. Thus, in the HOLD mode, both registers retain their current contents unless they are reset. With $S_3$ in the SAMPLE mode, register contents are updated as necessary.

It should be noted that this SAMPLE/HOLD switch is not to be confused with the sample-and-hold circuit shown in FIG. 2. The SAMPLE/HOLD Switch $S_3$ is activated by depressing a key on the display console (not shown) and may be actuated at any time during the test period. The sample-and-hold circuit 14 is a part of the analog input stage, and its function is automatically enabled whenever an input voltage is supplied to the differential amplifier 10.

STORE commands are generated by the $Q_{14}$ output of the 14-bit binary counter 24. On both 1 to 0 and 0 to 1 transitions, $Q_{14}$ triggers a one-shot which, after a six microsecond delay, triggers a second one-shot which produces STORE commands having a three microsecond pulse width. When $Q_{14}$ changes to a logical 1, the output of the Min register 38 is switched to the digital comparator 42, and if the new data sample is smaller than the contents of the Min register 38, $Q_{14}$ and the adder carry output allow one STORE pulse to propagate to the clock input of the Min register, storing the new data. When $Q_{14}$ changes to a logical 0, the output of the Max register 36 is switched to the digital comparator 42 and if the new data sample is larger than the contents of the Max register 36, $Q_{14}$ and the complemented adder carry output allow one STORE pulse to propagate to the clock input of the Max register 42, storing the new data. When the RESET switch is depressed, $Q_{14}$ is switched to the register inputs and STORE commands are applied to the clock inputs, so that the Max register 36 is set to zero and the Min register is set to full scale.

Figure 5:
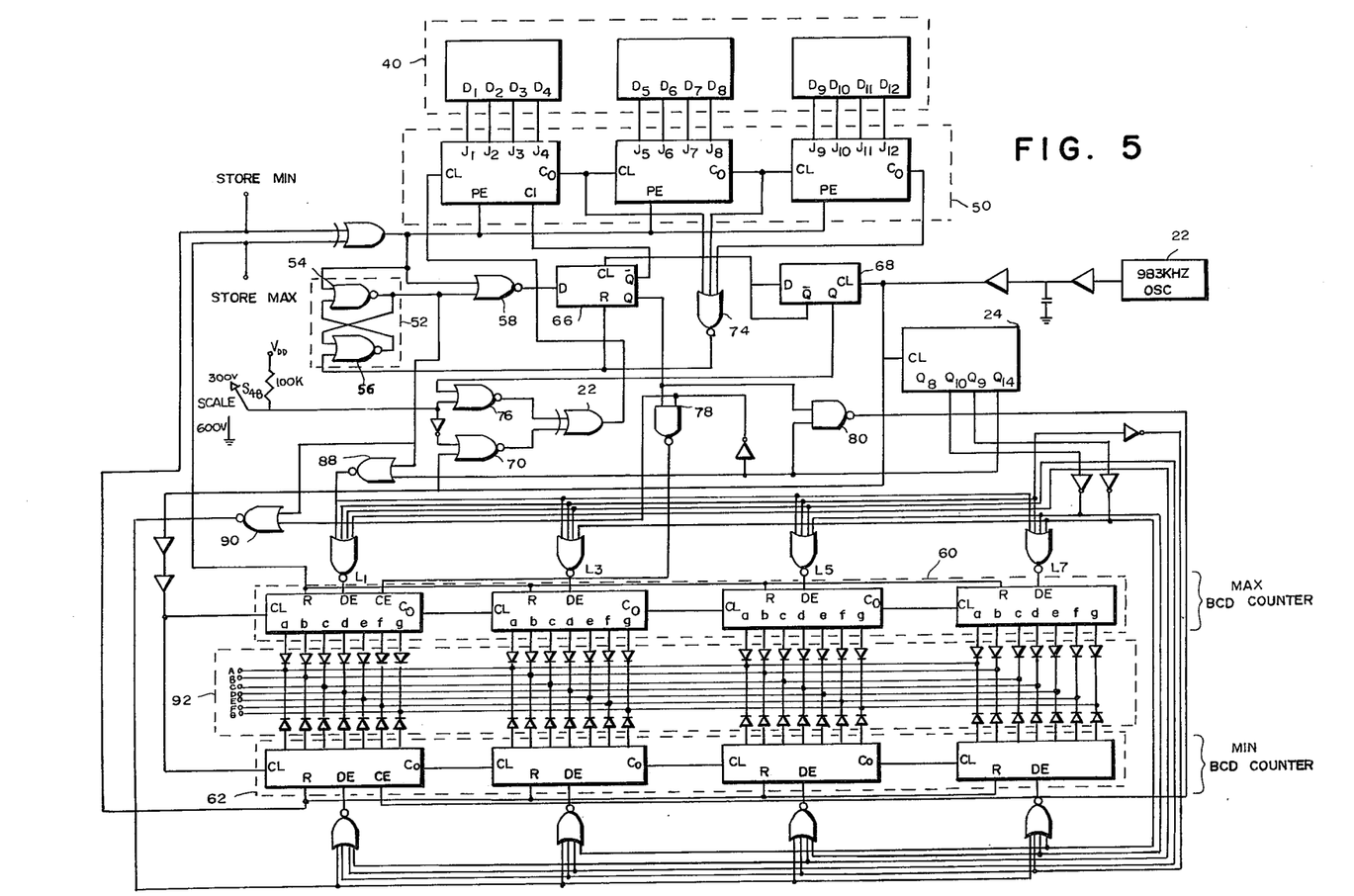
FIG. 5 is a circuit diagram of the binary-to-BCD conversion section of the line voltage monitor.

Data stored in the Max and Min registers is in binary form. For display, the stored data must be converted into binary coded decimal (BCD) representation. Each time data is stored in either register, the data is also loaded into a 12-bit binary presettable down counter 50. The binary counter is then decremented toward zero while a four-digit BCD up-counter increments. When the down-counter reaches zero, the BCD counter contains the BCD representation of the number stored in the register. Both the maximum and minimum registers have their own BCD up-counter 60 and 62. The proper counter is activated by the control and timing logic 64.

With $S_4$ set to the 300 V scale, the binary counter 50 and BCD counters 60 and 62 count pulses at the 938 kHz clock frequency; however, with $S_4$ set to the 600 V scale, the binary counter is driven with a signal having half the frequency of the 983 kHz clock. In this mode of operation, the number accumulated in the BCD counter 60 or 62 is twice the contents of the respective register. Overall system gain remains constant, since the gain of the analog differential amplifier is halved at the same time the "gain" of the digital section is doubled. This method prevents saturation of the input stages up to 614 volts, while providing increased accuracy under 300 volts.

The 12-bit down-counter 50 consists of three RCA CS4029's (see FIG. 5). The A inputs to the digital comparator 42 are also the preset inputs to this 12-bit counter since they are time-shared between the Max and Min register outputs. As data is stored in a register, the STORE pulse presets the 12-bit counter to the new register contents, sets an R-S flipflop 52 composed of two cross-coupled NOR gates 54 and 56, and clears the appropriate BCD counter 60 and 62. A third NOR gate 58 acts to prevent counting by either counter until termination of the STORE pulse.

A D flipflop (RCA CD4013) 66 and several delay elements are used to produce the proper timing relationship between the clock input to the binary counter 50, the clock input to the BCD counters 60 and 62, and the initiation of counting. Upon termination of a STORE pulse, the D input of the flipflop becomes a logical 1. This information is transferred to the outputs when the flipflop's clock input changes from a logical 0 to a logical 1. The signal applied to the flipflop's clock input is a 491.5 kHz square wave attained by drivng another D flipflop (RCA CD4013) 68 configured as a toggle flipflop with the 938 kHz crystal oscillator 22. Two NOR gates 70 and 76 and one Exclusive OR 72 are used to select either the 983 kHz or the 491.5 kHz signal as a clock for the binary counter as appropriate for the 300 V or 600 V scale, respectively. Propagation delay through the two levels of gating assures that the binary counter 50 will be gated on before the first transition to be counted occurs. Propagation delays are intentionally introduced between the crystal oscillator 22 and the clock input of the proper BCD counter 60 or 62 so that the binary counter 50 begins counting before the BCD counter. When the binary counter decrements to zero, all three carry outputs go low, causing a 3-input NOR gate 74 to reset both the R-S and D flipflops 52 and 66, and counting ceases until new data is again stored in a register.

Figure 6:
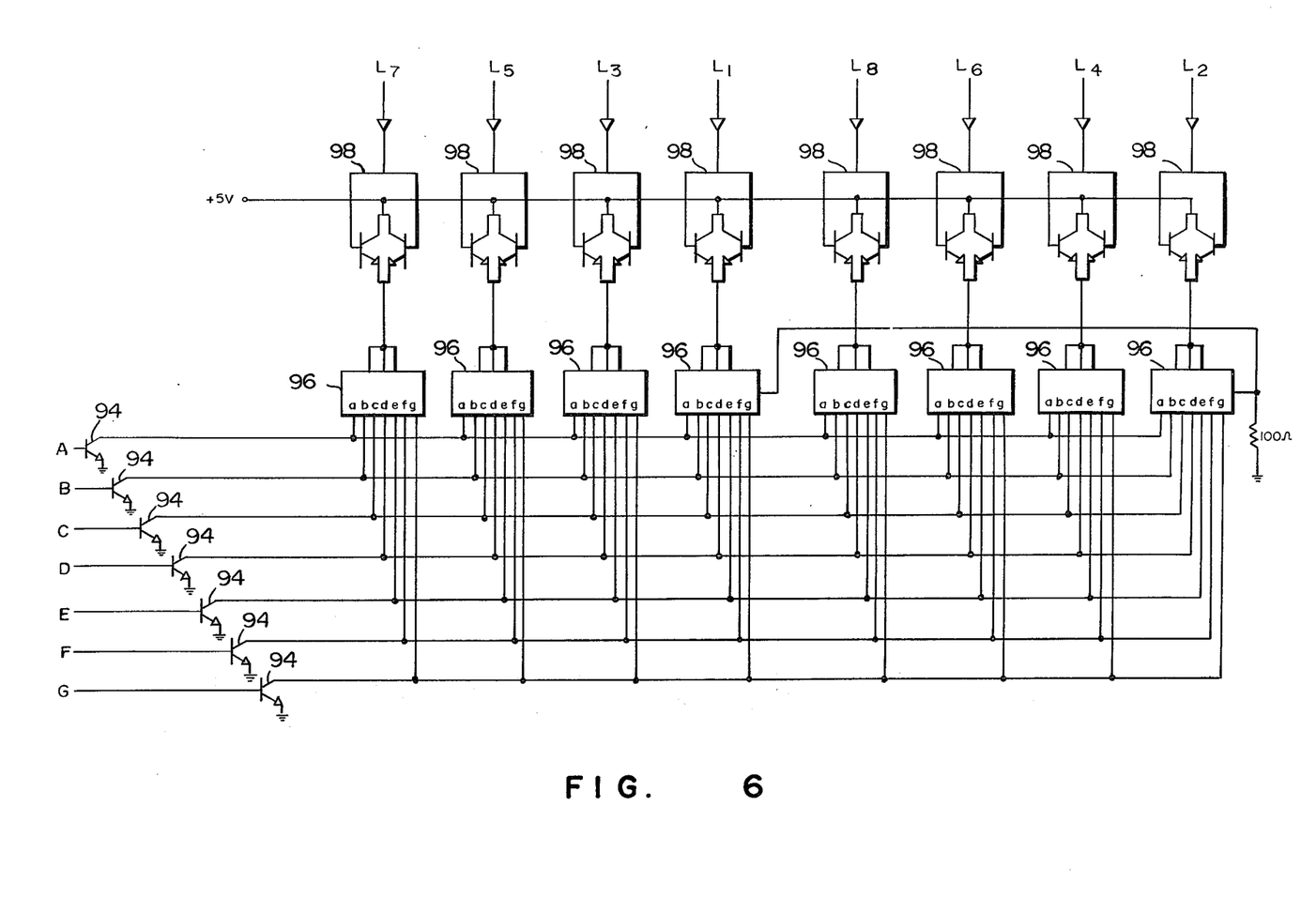
FIG. 6 is a circuit diagram of the display section of the line voltage monitor.

As indicated above, for each of the two registers 36 and 38, there is a companion BCD counter for display purposes. When data is stored in the Max register 36, the Max BCD counter 60 is reset and gated on. When data is stored in the Min register 38, the Min BCD counter 63 is reset and gated on. The output of the D flipflop 66 in NANDed 78 with $\overline{Q}_{14}$ to gate on the Max counters 60 and with $Q_{14}$ 80 to gate on the Min counter 62. The BCD counters (four RCA CD4026's) also perform BCD to seven-segment decoding, so that the outputs can be used to drive a maximum and minimum LED display 84 and 86. A logical 0 on the DISPLAY ENABLE (DE) input forces all outputs low, allowing for multiplexing of the display.

The LED display is time division multiplexed 82 for low power consumption. Blanking is provided by eight-input NOR gates that feed the DISPLAY ENABLE inputs of the counters 60 and 62. Four of these gates $L_1$, $L_3$, $L_5$, and $L_7$ are used with the maximum counter 60, and the other four, $L_2$, $L_4$, $L_6$ and $L_8$ are used in conjunction with the minimum counter 62. One input to the NOR gates blanks the display while the counter is changing: the output of the R-S flipflop 52 is NORed with $Q_{14}$ 88 for blanking the Max display 84 and with $\overline{Q}_{14}$ 90 for blanking the Min display 86 during binary to BCD conversion. The $Q_8$, $Q_9$, and $Q_{10}$ outputs of the 14-bit binary counter-frequency divider 24, along with their complements, are arranged among the eight NOR gates so that the digits are displayed one by one in the order indicated by $L_1$ through $L_8$. The multiplex rate is 983 kHz ÷ $2^8$ = 3.84 kHz. The seven-segment outputs of the counters are ORed together with diodes to form seven common segment lines (a through g). Lines a through g drive RCA CA3081 transistors 94 to control current flow through the segments of the LED display (see FIG. 6). Again, each segment line connects to all (Monsanto 1A) displays. The common anodes of each display digit are driven, through buffers and RCA CA 3082 transistors 98, by the same NOR gates that disable the seven-segment decoder outputs. Current is supplied to the single display digit corresponding to the CD4026 whose DISPLAY ENABLE input is a logical 1. During binary to BCD conversion, no current is allowed to flow through the respective LED display digits.

The output of the LVM is displayed on dual LED displays which provides a numerical readout of the contents of the maximum and minimum registers, 36 and 38 respectively. Standard circuitry such as Monsanto MAN 1A displays 96 are used for this purpose. The common anodes of each supply digit are driven, through buffers and transistors, by the same NOR gates that disable the seven segment decoder outputs. Current is supplied to the single display digit corresponding to the CD 4026 whose DISPLAY ENABLE input is a logical 1. During binary to BCD conversion, no current is allowed to flow through respective LED display digits.

The decimal point is positioned between the two rightmost digits in both the Max and Min displays by sinking current from the decimal point diode (DP) through a 100 Ohm resistor 100. This provides an effective "gain" of 1/10. The overall system gain then becomes $(1/90)(2.072)(409.5)(¾)(1/10) = 0.7071$ on the 300 V scale, and $(1/180)(2.072)(409.5)(¾)(2)(1/10) = 0.7071$ on the 600 V scale. Thus, the system in effect divides the input by $\sqrt{2}$ to provide an RMS representation of the input for a 60.0 Hz sine wave.

The Line Voltage Monitor will be used to determine line voltage regulation of the primary supply to a diagnostic X-ray source. In normal operation, the inputs are connected across the primary power as close to the X-ray source as possible, and machine technique factors are selected to those specified by the equipment manufacturer as constituting the maximum line current condition. Line voltage regulation can be determined to ± 0.1% for exposure times of 25 milliseconds (1/40 sec) or longer. If the maximum line current condition requires an exposure time of less than 25 miliseconds, technique factors will be set as close as possible to those constituting a maximum line current condition, with an exposure time of 25 milliseconds, tube current as specified by the manufacturer, and the highest kVp allowed by the rating curves of the X-ray tube at that exposure time and tube current.

As soon as possible after the Line Voltage Monitor is reset, an exposure is made with the instrument in the SAMPLE mode. Upon completion of the exposure, the device is placed in the HOLD mode, and line voltage regulation is computed as $[(V_{max} - V_{min})/V_{min}](100\%)$. Allowing the device to sample for only a short time before and after the exposure minimizes the possibility of recording fluctuations in line voltage due to loads other than the diagnostic X-ray source.

It will be obvious to those skilled in the art that various changes may be made without departing from the scope of the invention and the invention is not to be considered limited to what is shown in the drawing and described in the specification.

For example, the circuitry used to measure AC voltage fluctuations can also be modified to measure fluctuations in current, temperature, pressure, force, velocity, displacement, frequency, light intensity, or any other physical quantity. The requirements are that there be a transducer whose output voltage signal is low frequency (1 Hz or less) and proportional to the quantity to be measured. In this case, the gain of the analog section is adjusted such that the readout is in physical units, and the A/D is allowed to "free run" at 60 samples per second by grounding the R input to the RCA CD4020 24.

What is claimed is:

1. A monitor for the determination and display of sag and surge voltage values of an AC power supply comprising:
   voltage input means for receiving an AC input signal from an AC power supply;
   an analog/digital converter means coupled to said input means for converting said AC input signal into a binary number;
   a digital comparator means coupled to said analog/digital converter for determining the sag and surge values of said AC input signal;

maximum storage means coupled to said digital comparator for storing the binary number value of said surge value;

minimum storage means distinct from said maximum storage means coupled to said digital comparator for storing the binary number value of said sag value;

a digital switch means and timing means coupled between each of said minimum and said maximum storage means and said comparator, for indicating which binary number stored in the maximum storage means and the maximum storage means is to be compared with the binary number stored in said comparator; and output means coupled to said maximum storage means and to said minimum storage means for displaying sag and surge values.

2. A monitor according to claim 1, wherein said input means comprises a differential amplifier, a lowpass filter and a sample-and-hold circuit connected in series between said AC power supply and said analog/digital converter.

3. A monitor according to claim 2, further comprising a further timing means in circuit with said sample-and-hold circuit for enabling a periodic sample of said AC input signal to be stored in said sample-and-hold circuit.

4. A monitor according to claim 3, further comprising a switching means controlled by said further timing means for feeding said sample from said sample-and-hold circuit to said converter only during sample time periods.

5. A monitor according to claim 1, further comprising a scaler connected between said analog/digital converter and said digital comparator.

6. A monitor according to claim 1, further comprising a further digital switch means connected to said maximum and minimum storage means for resetting the values stored in said maximum storage means and said minimum storage means.

7. A monitor according to claim 1, wherein said output means comprises:

a binary down counter connected to said second digital switch means;

a maximum BCD counter connected to said down counter;

a minimum BCD counter connected to said down counter;

whereby when a value is stored in said maximum or minimum storage means, the same value is introduced into said down counter, this value being then converted into binary coded decimal representation.

8. A monitor according to claim 7, whereby said output means further comprises dual light emitting diode displays for providing a numerical readout of the contents of said maximum and said minimum registers.

9. A monitor for the determination and display of sag and surge voltage values of an AC power supply comprising:

voltage input means for receiving an AC input signal from an AC power supply;

an analog/digital converter means coupled to said input means for converting said AC input signal into a binary number;

a digital comparator means coupled to said analog/digital converter for determining the sag and surge values of said AC input signal;

maximum storage means coupled to said digital comparator for storing the binary number value of said surge value;

minimum storage means distinct from said maximum storage means coupled to said digital comparator for storing the binary number value of said sag value;

means coupled between each of said minimum and said maximum means and said comparator means, for indicating which binary number stored in the maximum storage means and said minimum storage means is to be compared with the binary number stored in said comparator; and output means coupled to said maximum storage means and to said minimum storage means for displaying sag and surge values.

* * * * *

UNITED STATES PATENT AND TRADEMARK OFFICE
CERTIFICATE OF CORRECTION

PATENT NO. : 4,006,413
DATED : February 1, 1977
INVENTOR(S) : Jeffrey L. Silberberg It is certified that error appears in the above–identified patent and that said Letters Patent are hereby corrected as shown below:

Column 2, line 42, "1VM" should read --LVM--

Column 5, line 44, "(RCA CS4013)" should read --(RCA CD4013)--

Column 6, line 43, "CS4029's" should read --CD4029's--

Signed and Sealed this fifth Day of July 1977

[SEAL]

Attest:

RUTH C. MASON
*Attesting Officer*

C. MARSHALL DANN
*Commissioner of Patents and Trademarks*